(12) United States Patent
Haselden et al.

(10) Patent No.: US 7,355,239 B1
(45) Date of Patent: Apr. 8, 2008

(54) FABRICATION OF SEMICONDUCTOR DEVICE EXHIBITING REDUCED DIELECTRIC LOSS IN ISOLATION TRENCHES

(75) Inventors: Barbara Haselden, Cupertino, CA (US); Yi Ding, San Jose, CA (US)

(73) Assignee: ProMOS Technologies Pte. Ltd., Singapore (SG)

( * ) Notice: Subject to any disclaimer, the term of this patent is extended or adjusted under 35 U.S.C. 154(b) by 0 days.

(21) Appl. No.: 11/514,743

(22) Filed: Aug. 31, 2006

(51) Int. Cl.
*H01L 29/76* (2006.01)
*H01L 21/336* (2006.01)
(52) U.S. Cl. .............. 257/314; 257/315; 257/E21.206; 257/E21.682; 438/257; 438/263; 438/264
(58) Field of Classification Search ........ 438/257–267; 257/E21.206, E21.682, E21.683, 314, 315, 257/324, 330
See application file for complete search history.

(56) References Cited

U.S. PATENT DOCUMENTS

| | | | |
|---|---|---|---|
| 5,933,729 A | 8/1999 | Chan | |
| 5,948,703 A | 9/1999 | Shen et al. | |
| 6,743,675 B2 | 6/2004 | Ding | |
| 6,844,586 B2 | 1/2005 | Ding | |
| 6,846,712 B2 | 1/2005 | Ding | |
| 7,015,099 B2 * | 3/2006 | Kim et al. | 438/257 |

* cited by examiner

*Primary Examiner*—Hsien-Ming Lee
(74) *Attorney, Agent, or Firm*—MacPherson Kwok Chen & Heid LLP; Brent A. Folsom

(57) ABSTRACT

Improved methods of manufacturing semiconductor devices are provided to reduce dielectric loss in isolation trenches of the devices. In one example, a method of manufacturing a semiconductor device includes forming a plurality of shallow trench isolation (STI) trenches in a substrate. A tunnel oxide layer, a first conductive layer, a gate dielectric layer, and a second conductive layer are formed above the substrate. The layers are etched to delineate a plurality of stacked gate structures. In particular, the etching may include: performing a first etch of the second conductive layer, wherein at least a portion of the second conductive layer above the STI trenches remains following the first etch; and performing a second etch of the second conductive layer, wherein the remaining portion of the second conductive layer above the STI trenches and portions of the gate dielectric layer above the STI trenches are completely removed by the second etch.

25 Claims, 7 Drawing Sheets

FABRICATION OF SEMICONDUCTOR DEVICE EXHIBITING REDUCED DIELECTRIC LOSS IN ISOLATION TRENCHES

BACKGROUND

1. Field of the Invention

The present invention relates to semiconductor devices employing floating gates and isolation trenches.

2. Related Art

As is well known, semiconductor devices may be implemented with various structures to provide non-volatile memories which are useful in a variety of different applications. Stacked gate structures that include stacked floating gates and control gates are often used to fabricate non-volatile memory cells (e.g., flash memory cells) which may be selectively programmed, unprogrammed, and reprogrammed through the application of appropriate voltages.

Large numbers of non-volatile memory cells may be fabricated on a common substrate to provide an array of non-volatile memory cells. In order to isolate individual non-volatile memory cells from each other, various isolation techniques have been developed. Shallow trench isolation (STI) is one such technique. In this approach, a plurality of trenches are formed between active areas of the non-volatile memory cells. The trenches are filled with a dielectric which serves to isolate active areas (for example, source/drain implants and active channels) of adjacent non-volatile memory cells.

It is important that the trenches are sufficiently filled with the dielectric in order to provide meaningful isolation between active areas. Unfortunately, conventional manufacturing techniques used in the formation of stacked gate structures can often damage the dielectric in the trenches, thereby compromising the isolation provided by the trenches.

For example, conventional non-volatile memory cells may include a gate dielectric layer formed on top of the trenches and active areas, and a polysilicon layer formed on top of the gate dielectric layer. In order to form control gates for the non-volatile memory cells, the control gate topography is masked and the unmasked portions of the polysilicon layer and the underlying gate dielectric layer are etched in a single etching step.

During the etching, the entirety of the polysilicon layer and the gate dielectric layer above the trenches are removed. Unfortunately, because of the lack of selectivity between these two exposed layers during etching, the underlying trenches between the floating gates may also be significantly etched and damaged. In particular, the etching may cause significant amounts of the dielectric in the trenches between the active areas to be etched away.

As a result, the isolation characteristics of the trenches can become seriously compromised. Source/drain implants provided in the active areas may not be sufficiently isolated from each other, resulting in short circuit between active areas of adjacent non-volatile memory cells. Such conditions can cause complete failure of one or more non-volatile memory cells. Although deeper isolation trenches may sometimes be employed to reduce such effects, the use of deeper trenches can significantly increase the self-aligned source (SAS) resistance and furthermore may be impractical for semiconductor devices having small feature sizes (for example, filling the trenches with the dielectric may be impractical).

Accordingly, there is a need for an improved manufacturing process for non-volatile memory cells. In particular, for example, there is a need for a manufacturing process that reduces the loss of dielectric material in trenches while still providing sufficient etching to delineate stacked gate structures of the non-volatile memory cells.

SUMMARY

In accordance with one embodiment of the present invention, a method of manufacturing a semiconductor device includes forming a plurality of isolation trenches in a substrate; filling the isolation trenches with a trench dielectric; forming a tunnel oxide layer on the substrate above active areas of the semiconductor device between the isolation trenches; forming a first polysilicon layer on the tunnel oxide layer to provide a plurality of floating gates; forming a gate dielectric layer on the floating gates above the active areas and on exposed portions of the trench dielectric; forming a second polysilicon layer on the gate dielectric layer; partially etching the second polysilicon layer above the isolation trenches, wherein at least a portion of the second polysilicon layer above the isolation trenches remains following the partial etching; and further etching the second polysilicon layer and the gate dielectric layer above the isolation trenches, wherein a remaining portion of the second polysilicon layer above the active areas provides a plurality of control gates.

In accordance with another embodiment of the present invention, a method of manufacturing a semiconductor device includes forming a plurality of shallow trench isolation (STI) trenches in a substrate; forming a tunnel oxide layer, a first conductive layer, a gate dielectric layer, and a second conductive layer above the substrate; and etching to delineate a plurality of stacked gate structures, wherein the etching comprises: performing a first etch of the second conductive layer, wherein at least a portion of the second conductive layer above the STI trenches remains following the first etch, and performing a second etch of the second conductive layer, wherein the remaining portion of the second conductive layer above the STI trenches and portions of the gate dielectric layer above the STI trenches are completely removed by the second etch.

In accordance with another embodiment of the present invention, a non-volatile memory includes: a substrate; a plurality of isolation trenches in the substrate; a trench dielectric in the isolation trenches; a plurality of active areas in the substrate between the isolation trenches; a plurality of stacked gate structures above the active areas, wherein each of the stacked gate structures comprise: a tunnel oxide layer on the substrate, a floating gate formed from a first conductive layer on the tunnel oxide layer, a gate dielectric layer on the floating gate, and a control gate formed from a second conductive layer on the gate dielectric layer; and wherein the stacked gate structures are delineated by: portions of the second conductive layer subjected to a first partial etch and a second complete etch, and portions of the gate dielectric layer subjected to the second complete etch.

These and other features and advantages of the present invention will be more readily apparent from the detailed description of the embodiments set forth below taken in conjunction with the accompanying drawings.

BRIEF DESCRIPTION OF THE FIGURES

Like element numbers in different figures represent the same or similar elements.

DETAILED DESCRIPTION

Figure 6:
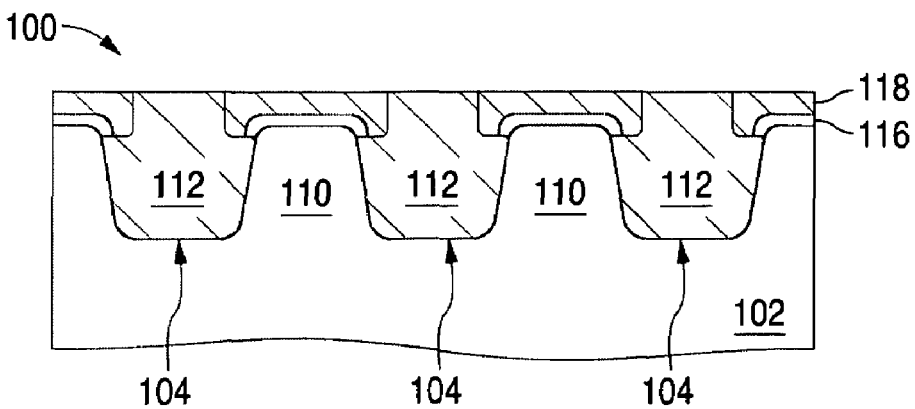
FIG. 6 provides a cross-section view of a portion of a semiconductor device with a first polysilicon layer formed over a top surface of the semiconductor device during a manufacturing process in accordance with an embodiment of the present invention.
Figure 7:
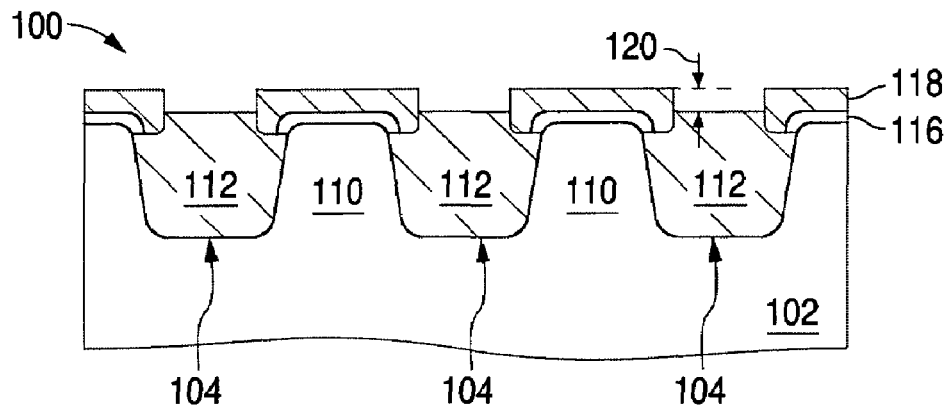
FIG. 7 provides a cross-section view of a portion of a semiconductor device with a dielectric etched such that a top surface of the dielectric is at a level below a top surface of a first polysilicon layer during a manufacturing process in accordance with an embodiment of the present invention.
Figure 8:
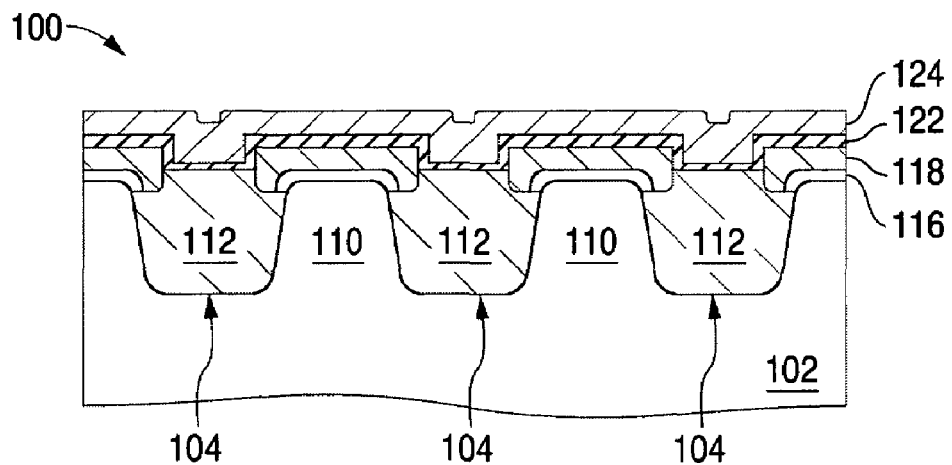
FIG. 8 provides a cross-section view of a portion of a semiconductor device with a gate dielectric layer formed on top of exposed portions of a dielectric and a first polysilicon layer, and a second polysilicon layer formed on top of the gate dielectric layer, during a manufacturing process in accordance with an embodiment of the present invention.
Figure 9A:
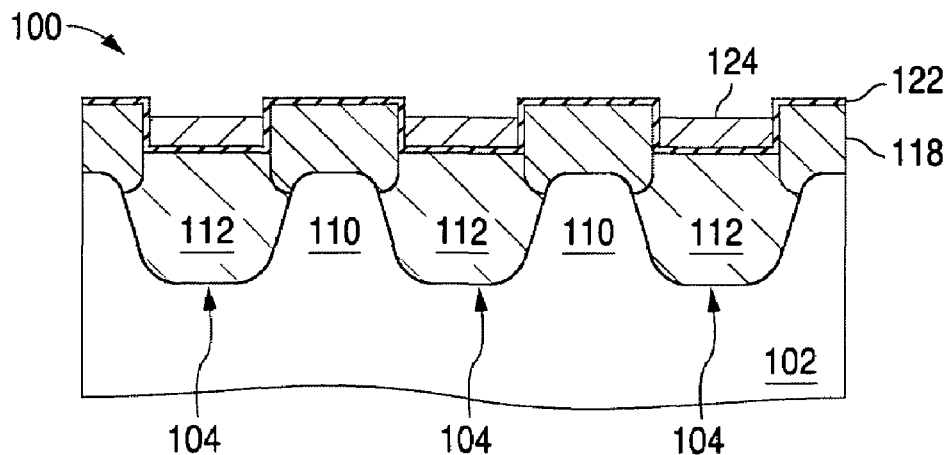
FIG. 9A provides a first cross-section view of a portion of a semiconductor device with a partially etched second polysilicon layer during a manufacturing process in accordance with an embodiment of the present invention.
Figure 9B:
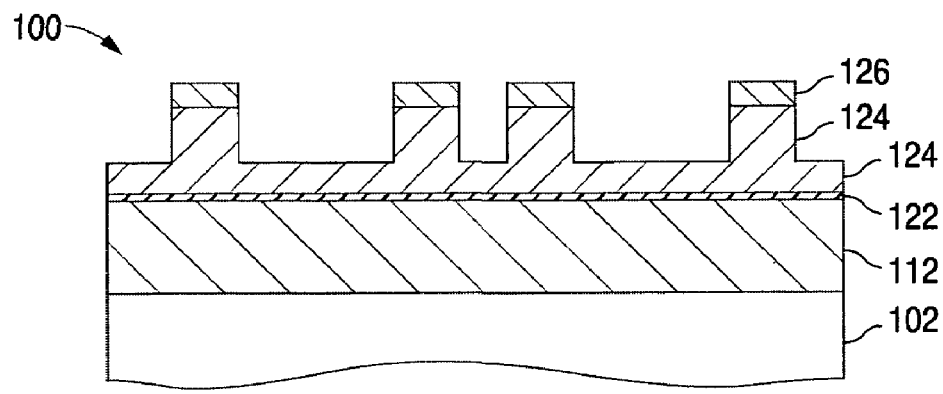
FIG. 9B provides a second cross-section view of a portion of a semiconductor device with a partially etched second polysilicon layer during a manufacturing process in accordance with an embodiment of the present invention.
Figure 9C:
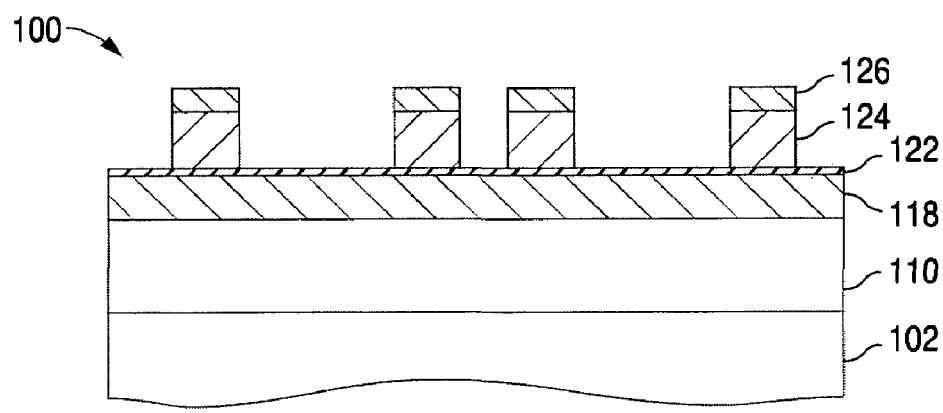
FIG. 9C provides a third cross-section view of a portion of a semiconductor device with a partially etched second polysilicon layer during a manufacturing process in accordance with an embodiment of the present invention.
Figure 9D:
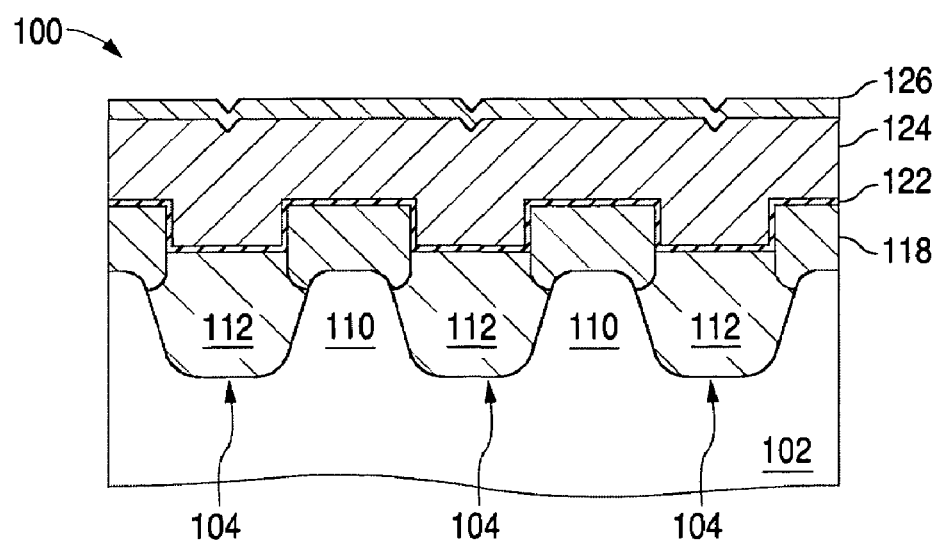
FIG. 9D provides a fourth cross-section view of a portion of a semiconductor device with a partially etched second polysilicon layer during a manufacturing process in accordance with an embodiment of the present invention.
Figure 9E:
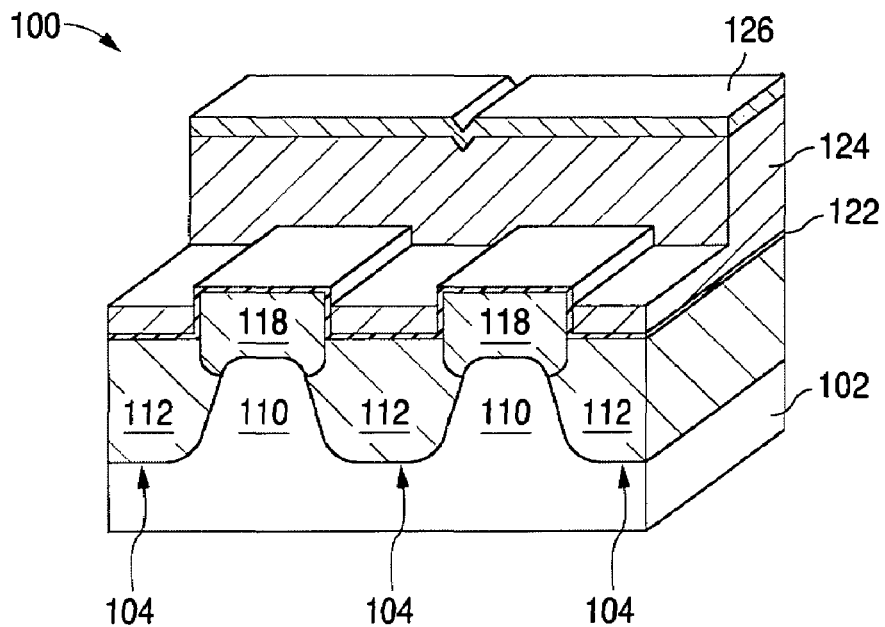
FIG. 9E provides a perspective view of a portion of a semiconductor device with a partially etched second polysilicon layer during a manufacturing process in accordance with an embodiment of the present invention.
Figure 10A:
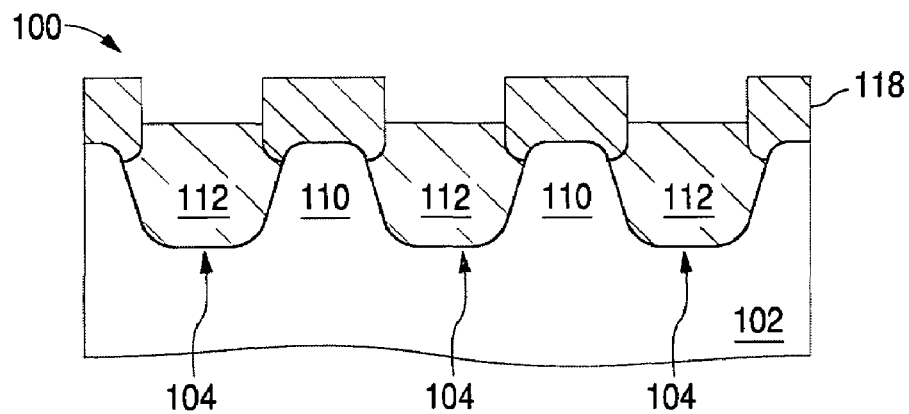
FIG. 10A provides a first cross-section view of a portion of a semiconductor device with remaining unmasked portions of a second polysilicon layer and a gate dielectric layer removed during a manufacturing process in accordance with an embodiment of the present invention.
Figure 10B:
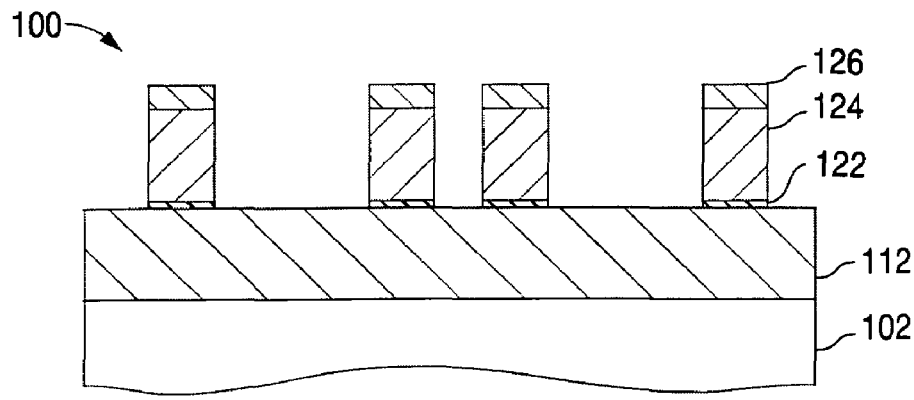
FIG. 10B provides a second cross-section view of a portion of a semiconductor device with remaining unmasked portions of a second polysilicon layer and a gate dielectric layer removed during a manufacturing process in accordance with an embodiment of the present invention.
Figure 10C:
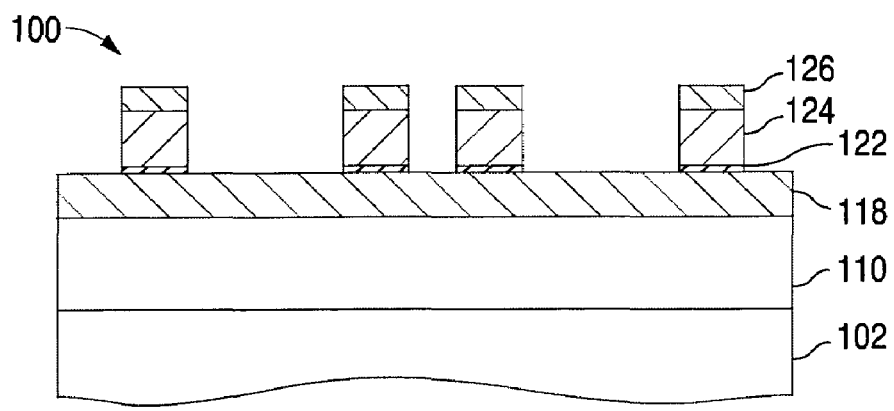
FIG. 10C provides a third cross-section view of a portion of a semiconductor device with remaining unmasked portions of a second polysilicon layer and a gate dielectric layer removed during a manufacturing process in accordance with an embodiment of the present invention.
Figure 10D:
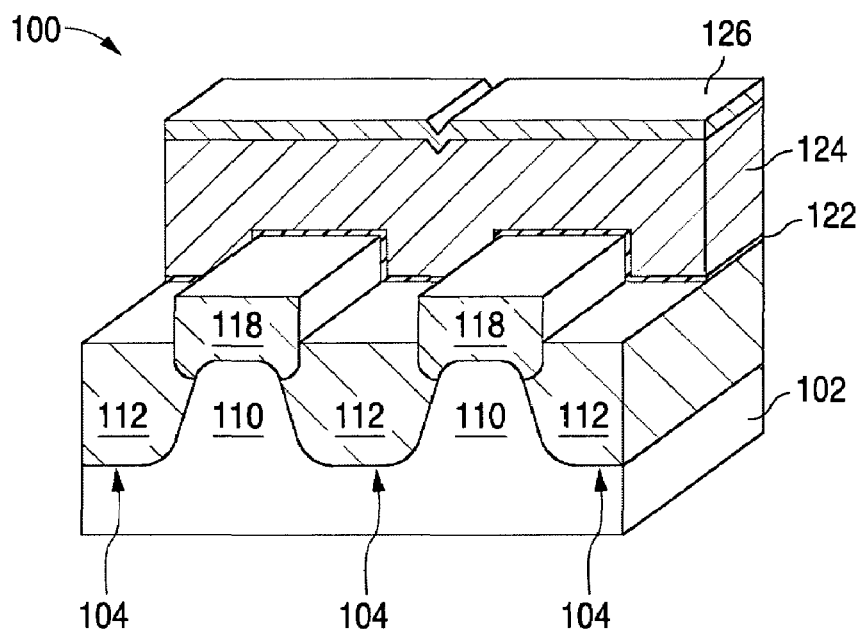
FIG. 10D provides a perspective view of a portion of a semiconductor device with remaining unmasked portions of a second polysilicon layer and a gate dielectric layer removed during a manufacturing process in accordance with an embodiment of the present invention.

Referring now to the drawings wherein the showings are for purposes of illustrating embodiments of the present invention only, and not for purposes of limiting the same, FIGS. 1-11B provide various cross-section and perspective views of portions of a semiconductor device 100 undergoing a manufacturing process in accordance with an embodiment of the present invention. FIG. 12 provides a top view of semiconductor device 100 following the manufacturing process of FIGS. 1-11B. In this regard, the views of FIGS. 1-7, 9A, and 10A are taken along line C-C' of FIG. 14 during various processing steps in the manufacture of semiconductor device 100. Similarly, the views of FIGS. 9B and 10B are taken along line A-A', the views of FIGS. 9C, 10C, and 11A are taken along line B-B' of FIG. 14, and the views of FIGS. 8 and 9D are taken along line D-D' of FIG. 14. Additional views provided by other figures will be further described herein.

Figure 1:
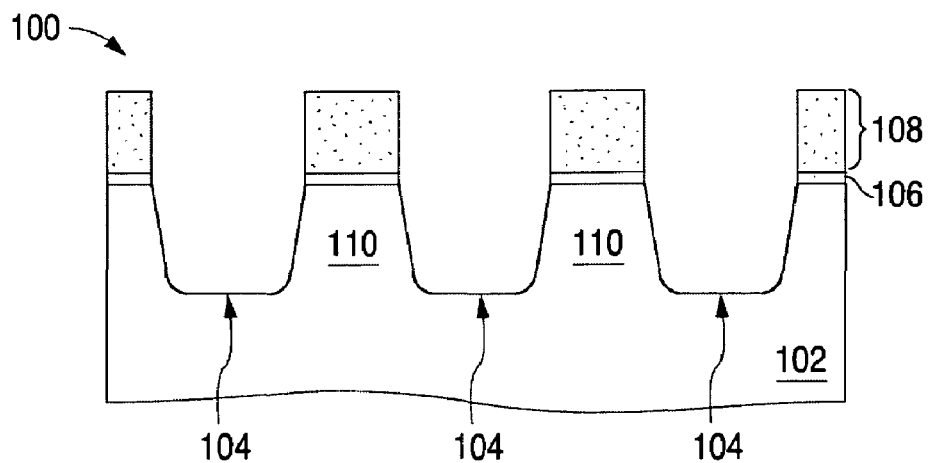
FIG. 1 provides a cross-section view of a portion of a semiconductor device with a substrate, a pad oxide layer, a silicon nitride layer, and isolation trenches during a manufacturing process in accordance with an embodiment of the present invention.

As illustrated in FIG. 1, semiconductor device 100 is provided with a substrate 102, such as a monocryslalline semiconductor substrate. Although substrate 102 will be described herein as having the characteristics of a P-type substrate, it will be appreciated that the use of an N-type substrate is also contemplated.

A pad oxide layer 106 (e.g., silicon dioxide) is formed on a top surface of substrate 102 by thermal oxidation or other techniques known in the art. A silicon nitride layer 108 is deposited on pad oxide layer 106 using a photoresist mask (not shown) in accordance with photolithographic techniques.

It will be appreciated that silicon nitride layer 108 effectively masks portions of pad oxide layer 106 and substrate 102. As a result, pad oxide layer 106 and substrate 102 may be etched through the openings in silicon nitride layer 108 to form isolation trenches 104. Isolation trenches 104 may be filled with a dielectric to implement shallow trench isolation ("STI") trenches which may isolate various portions of semiconductor device 100 as further described herein. Isolation trenches 104 are illustrated in FIG. 1 as having sloping sidewalls with the trenches exhibiting greater width at the top. However, in other embodiments, isolation trenches 104 may be implemented as exhibiting greater width at the top or substantially vertical sidewalls.

Unetched portions of substrate 102 adjacent to isolation trenches 104 form active areas 110 of non-volatile memory cells (e.g., flash memory cells) formed as part of semiconductor device 100. For example, during operation of semiconductor device 100, N-channels may be formed in active areas 110 under floating gates of semiconductor device 100.

Figure 2:
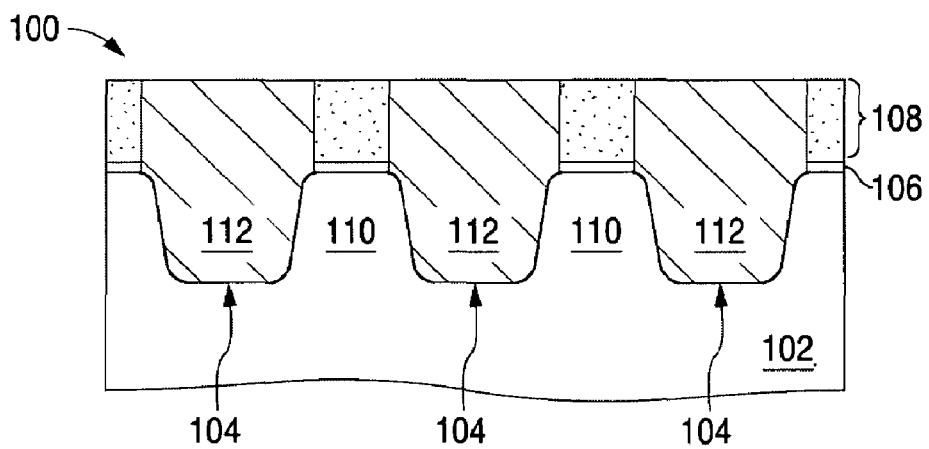
FIG. 2 provides a cross-section view of a portion of a semiconductor device with isolation trenches filled with a dielectric during a manufacturing process in accordance with an embodiment of the present invention.
Figure 3:
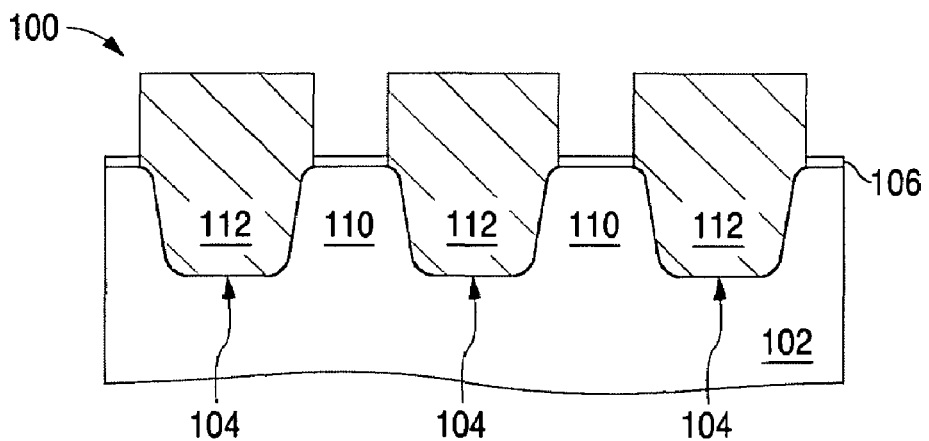
FIG. 3 provides a cross-section view of a portion of a semiconductor device with a silicon nitride layer selectively etched during a manufacturing process in accordance with an embodiment of the present invention.

Referring now to FIG. 2, silicon nitride layer 108 may be subjected to a wet etch to recess the vertical edges of the layer away from isolation trenches 104. A thin layer of silicon dioxide (not shown) may be thermally grown on exposed silicon surfaces of isolation trenches 104 to round the edges of the trenches. Isolation trenches 104 are then filled with a dielectric 112 (i.e., "trench dielectric"), such as silicon dioxide. In one embodiment, dielectric 112 may be deposited in accordance with a high density plasma process. Dielectric 112 may initially cover silicon nitride layer 108 and then be subsequently polished down to a top surface of silicon nitride layer 108 by a chemical mechanical planarization ("CMP") process to provide a planar top surface as illustrated in FIG. 2. As shown in FIG. 3, silicon nitride layer 108 is selectively removed from semiconductor device 100 in accordance with, for example, a wet etch process (e.g. with phosphoric acid).

Figure 4:
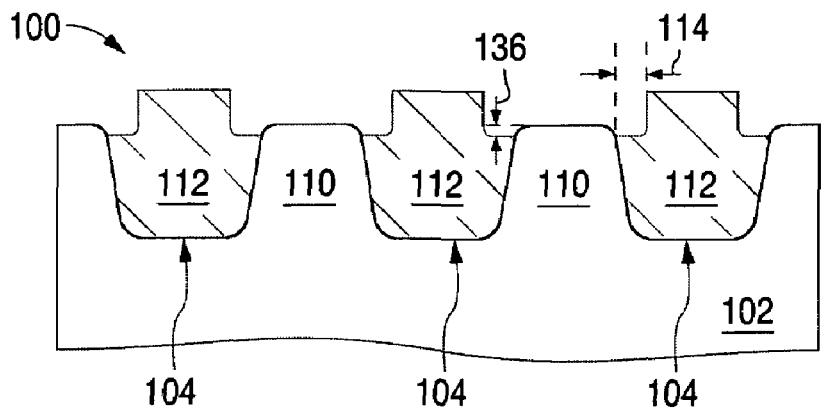
FIG. 4 provides a cross-section view of a portion of a semiconductor device with a pad oxide layer and a dielectric etched during a manufacturing process in accordance with an embodiment of the present invention.

Pad oxide layer 106 may then be etched as illustrated in FIG. 4. Optionally, the etch of FIG. 4 may include a horizontal component that causes sidewalls of dielectric 112 to be laterally recessed away from active areas 110 by a distance 114 (for example, approximately 300 angstroms). The etch of FIG. 4 may also optionally etch a portion of dielectric 112 out of isolation trenches 104 (for example, by a depth 136 of approximately 300 angstroms) near active areas 110 and cause top portions of the sidewalls of isolation trenches 104 to become exposed. In various embodiments, the etch of FIG. 4 may be implemented as an isotropic wet etch selective to silicon, a buffered oxide etch, or a dilute hydrofluoric acid (DHF) etch.

Figure 5:
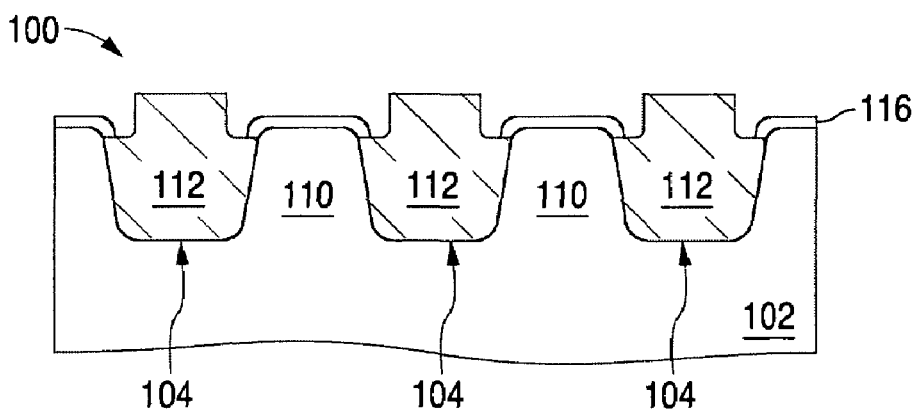
FIG. 5 provides a cross-section view of a portion of a semiconductor device with a silicon dioxide layer thermally grown on exposed portions of a substrate during a manufacturing process in accordance with an embodiment of the present invention.

Referring now to FIG. 5, a silicon dioxide layer 116 (also referred to as "tunnel oxide") is thermally grown on the exposed portions of substrate 102. In one embodiment, tunnel oxide 116 may exhibit a thickness of approximately 95 angstroms.

In FIG. 6, a first polysilicon layer 118 is formed over the top surface of semiconductor device 100. First polysilicon layer 118 is conductive and may be used to form floating gates of non-volatile memory cells of semiconductor device 100. In one embodiment, first polysilicon layer 118 may exhibit a depth of approximately 1000 angstroms. First polysilicon layer 118 may initially cover dielectric 112 and fill areas therebetween. First polysilicon layer 118 may be subsequently polished down to a top surface of dielectric 112 by a CMP process to provide a planar top surface as illustrated in FIG. 6. It will be appreciated that in embodiments where dielectric 112 has been optionally etched laterally (FIG. 4), first polysilicon layer 118 may project over isolation trenches 104 as illustrated in FIG. 6.

In FIG. 7, dielectric 112 is etched such that its top surface is at a level below the top surface of first polysilicon 118 by a depth 120 (for example, approximately 800 angstroms). In one embodiment, the etch of FIG. 7 may be implemented as a timed wet etch. As will be appreciated in subsequent steps described herein, the etch of FIG. 7 can permit portions of a subsequently-deposited second polysilicon layer to exhibit a greater thickness above isolation trenches 104.

As shown in FIG. 8, a gate dielectric layer 122 is formed on top of exposed portions of dielectric 112 and first polysilicon layer 118 of semiconductor device 100. Gate dielectric layer 122 may be implemented, for example, as an oxide-nitride-oxide ("ONO") multi-layer structure having a nitride layer situated between upper and lower oxide layers. Accordingly, gate dielectric layer 122 is also referred to herein as "ONO layer 122." In one embodiment, ONO layer 122 may exhibit a thickness of approximately 170 angstroms.

As also shown in FIG. 8, a second polysilicon layer 124 is formed on top of ONO layer 122. Second polysilicon layer 124 is conductive and may be used to form control gates for non-volatile memory cells of semiconductor device 100. As a result of the optional etch of FIG. 7, second poly silicon layer 124 may exhibit a greater thickness above isolation trenches 104 (for example, in the range of approximately 3100-3300 angstroms) than above active areas 110 (for example, in the range of approximately 2300-2500 angstroms).

As a result of the steps described above in relation to FIGS. 1-8, it will be appreciated that semiconductor device 100 provides a plurality of stacked gate structures which may be used to form non-volatile memory cells. In one embodiment, the steps of FIGS. 1-8 may also be implemented in accordance with the various structures and processes set forth in U.S. Pat. No. 6,743,675, which is incorporated by reference herein in its entirety. In another embodiment, first polysilicon layer 118 may be formed prior to the formation of isolation trenches 104 (i.e., self-aligned STI module formation).

Following the steps illustrated in FIG. 8, semiconductor device 100 may be further etched as illustrated in FIGS. 9A-11B to delineate the stacked gate structures and to expose dielectric 112 to facilitate the subsequent providing of source/drain implants in active areas 110. For purposes of clarity, tunnel oxide 116 is not shown in FIGS. 9A-11B.

Referring now to FIGS. 9A-9E, a hard mask 126 may be provided on second polysilicon layer 124 above floating gates 118. In one embodiment, hard mask 126 may be implemented as a cap oxide having a thickness of approximately 1200 angstroms. A partial etch of second polysilicon layer 124 is performed on the stacked gate structures of semiconductor device 100. As shown, the partial etch of FIGS. 9A-9E may remove a substantial amount of the unmasked portion of second polysilicon layer 124. However, at least a portion of second polysilicon layer 124 remains above isolation trenches 104 and dielectric 112. In one embodiment, the remaining portion of second polysilicon layer 124 may have a thickness in the range of approximately 800 angstroms. It will be appreciated that, as a result of the previous etch of dielectric 112 illustrated in FIG. 7, additional polysilicon can be provided adjacent to the floating gates formed from first polysilicon layer 118. Accordingly, additional polysilicon can remain above isolation trench 104 and dielectric 112 between the floating gates formed by the first polysilicon layer 118. As also shown in FIGS. 9A-9E, ONO layer 122 remains substantially unetched following the partial etch of second polysilicon layer 124.

In one embodiment, the partial etch of second polysilicon layer 124 illustrated in FIGS. 9A-9E may be performed with chlorine (Cl2) and/or hydrogen bromide (HBr). In such an embodiment, the partial etch can exhibit a selectivity between polysilicon and oxide of greater than 10:1, thereby allowing the partial etch of second polysilicon layer 124 to be performed with high precision to selectively etch second polysilicon layer 124 up to or above ONO layer 122.

FIGS. 10A-10D illustrate a further etch performed on semiconductor device 100. As shown, the etch of FIGS. 10A-10D removes the remaining unmasked portions of second polysilicon layer 124 and ONO layer 122. This etch of may also remove a portion of dielectric 112 of isolation trenches 104 (not shown in FIGS. 10A-D). In one embodiment, the etch of FIGS. 10A-10D may be performed for approximately 120 seconds. In such an embodiment, this 120 second etch time may result in the removal of approximately 600 angstroms of ONO layer 122. Advantageously, this etch can remove any remaining sidewall residues resulting from topography, as well as any remaining portions of second polysilicon layer 124 and ONO layer 122 above isolation trenches 104 and dielectric 112.

In one embodiment, the etch of ONO layer 122 illustrated in FIGS. 10A-10D may be a fluorine-based etch performed with, for example, carbon tetrachloride (CF4) and/or carbon hyrdo-trifluoride (CHF3). In such an embodiment, the ONO etch can exhibit a selectivity between polysilicon and oxide of approximately 2:1. This selectivity can advantageously prevent the ONO etch of FIGS. 10A-10D from etching through the portions of first polysilicon layer 118 in active areas 112 and therefore present the inadvertent removal of some or all of tunnel oxide 116 in a matter of seconds which would result in silicon pitting.

Figure 11A:
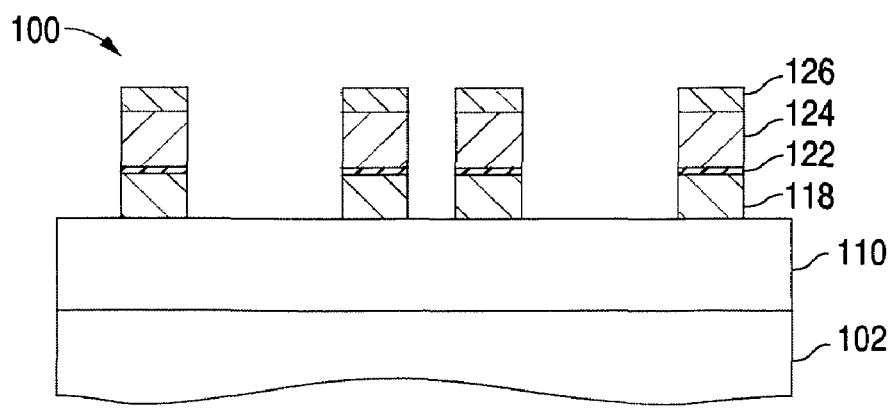
FIG. 11A provides a cross-section view of a portion of a semiconductor device with unmasked portions of a first polysilicon layer removed during a manufacturing process in accordance with an embodiment of the present invention.
Figure 11B:
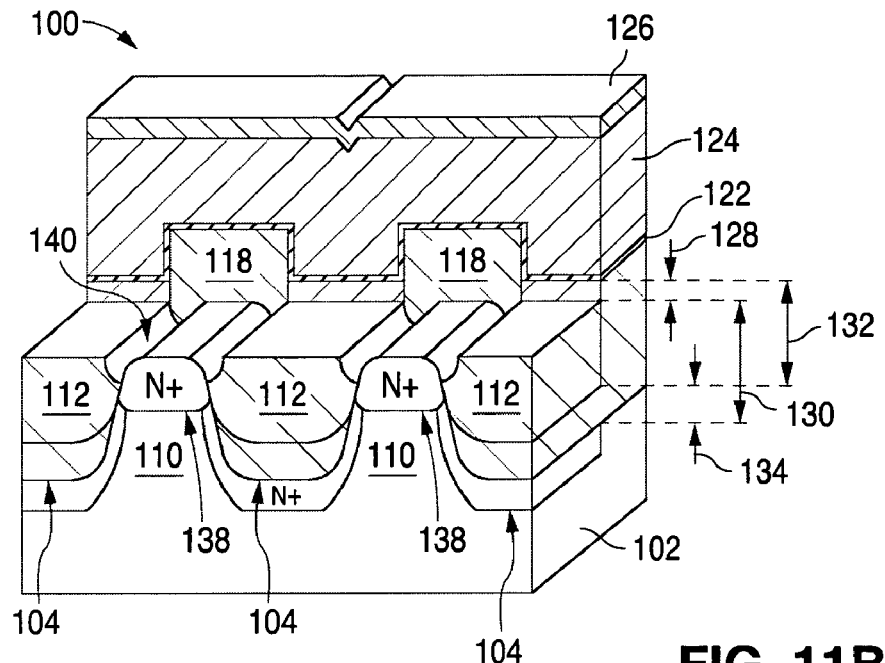
FIG. 11B provides a perspective view of a portion of a semiconductor device with unmasked portions of a first polysilicon layer removed during a manufacturing process in accordance with an embodiment of the present invention.
Figure 12:
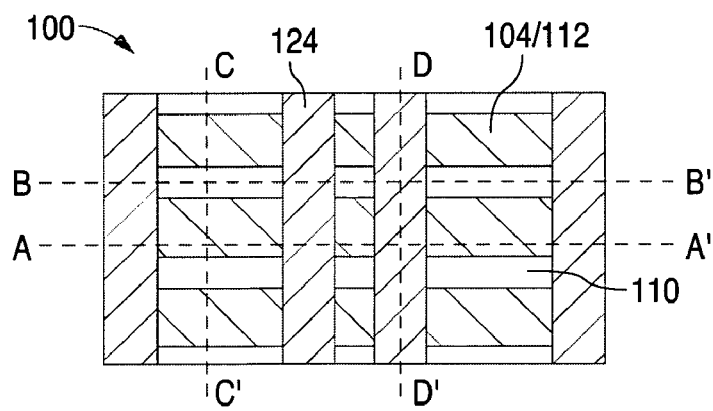
FIG. 12 provides a top view of the semiconductor device of FIGS. 1-11B in accordance with an embodiment of the present invention.

Following the partial etch of second polysilicon layer 124 (FIGS. 9A-9E) and the subsequent etch of ONO layer 122 (FIGS. 10A-10D), a further etch may be performed to remove unmasked portions of first polysilicon layer 118 as illustrated in FIGS. 11A-11B. For example, as shown in FIGS. 11A-11B, first polysilicon layer 118 has been removed above active areas 110 of semiconductor device.

As shown in the perspective view of FIG. 11B, semiconductor device 100 includes isolation trenches 104 filled with dielectric 112 which isolate active areas 110. For purposes of example, a plurality of N-type source/drain implants 138 are also shown. Floating gates formed from first polysilicon layer 118 are illustrated above active areas 110.

As illustrated in FIG. 11B, any unmasked portions of first polysilicon layer 118 are removed (for example, see trenches 140 where first polysilicon layer 118 has been etched). During the etch of FIGS. 10A-10D and/or 11A-11B, a portion of dielectric 112 may also be removed to a depth 128 as illustrated in FIG. 11B. In one embodiment, depth 128 may be less than or equal to approximately 500 angstroms. It will be appreciated that following this second etch, dielectric 112 will exhibit a remaining depth 130.

In contrast, a substantially larger portion of dielectric 112 may be removed to a depth 132 if the etching of the stacked gate structures is performed in accordance with a single large etch in accordance with a prior known method. It will be appreciated that following the prior known method, dielectric 112 will exhibit a remaining depth 134.

As shown in FIG. 11B, the depth 130 of dielectric 112 remaining following the process of FIGS. 1-11B is significantly larger than the depth 134 remaining following the prior known method. In particular, depth 130 provides an appreciably greater amount of dielectric 112 in isolation trenches 104 which may significantly improve the isolation of active areas 110 of semiconductor device 100.

By using the combination of the partial etch of FIGS. 9A-9E followed by the etch of FIGS. 10A-10D and/or FIGS. 11A-B, the stacked gate structures of semiconductor device 100 may be delineated with minimal loss to dielectric 112. In this regard, upon inspection of FIG. 11B, it will be appreciated that dielectric 112 and isolation trenches 104 are substantially intact. As a result, active areas 110 may remain isolated from each other. Accordingly, source/drain implants may be provided in active areas 110 with considerable thickness. The non-volatile memory cells formed with such source/drain implants and the illustrated stacked gate structures of semiconductor 100 may remain isolated from each other by dielectric 112 and isolation trenches 104.

Figure 13:
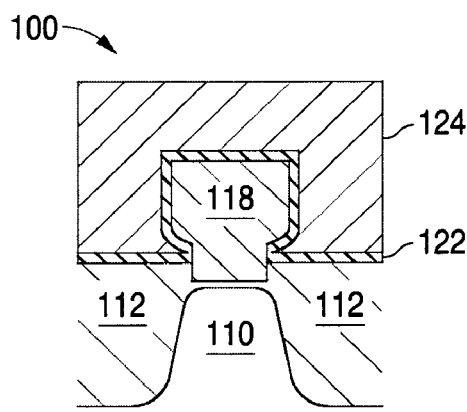
FIGS. 13 and 14 illustrate alternate floating gate profiles that may be employed in accordance with embodiments of the present invention.
Figure 14:
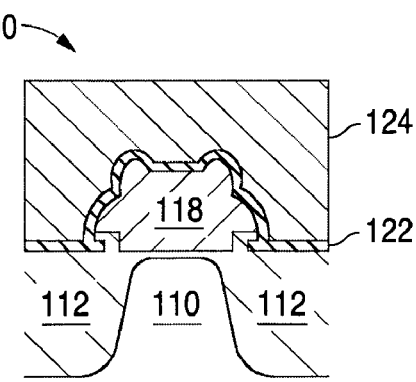

Although FIGS. 1-11B illustrate a given profile for floating gates formed from first polysilicon layer 118, it will be appreciated that other provides are also contemplated. For example, FIGS. 13 and 14 illustrate alternate floating gate profiles that may be employed in accordance with embodiments of the present invention. As shown in FIGS. 13 and 14, various floating gate profiles may be used to advantageously increase surface area of the interface between first polysilicon layer 118 and second polysilicon layer 124 across ONO layer 122, thereby increasing the capacitive coupling ratio of an associated non-volatile memory cell.

In view of the foregoing, it will be appreciated that semiconductor devices manufactured in accordance with the present disclosure may preserve additional dielectric material in isolation trenches which can improve isolation between active areas of non-volatile memory cells. In particular, by employing a partial etch of a second polysilicon layer (i.e., used to form control gates of the non-volatile memory cell), portions of the second polysilicon layer can be preserved above an ONO layer and the isolation trenches. The use of a subsequent ONO etch may effectively remove the remaining portions of the second polysilicon layer and the ONO layer above the isolation trenches without incurring significant loss of dielectric material in the isolation trenches in comparison to prior single etch approaches.

It will be appreciated that the various embodiments described herein, including the materials, conductivity types, dimensions, and other details, are provided for purposes of illustration and not limitation. Where applicable, the various components set forth herein can be combined into composite components and/or separated into sub-components without departing from the spirit of the present invention. Similarly, where applicable, the ordering of various steps described herein can be changed, combined into composite steps, and/or separated into sub-steps to provide features described herein.

The foregoing disclosure is not intended to limit the present invention to the precise forms or particular fields of use disclosed. It is contemplated that various alternate embodiments and/or modifications to the present invention, whether explicitly described or implied herein, are possible in light of the disclosure.

Having thus described embodiments of the present invention, persons of ordinary skill in the art will recognize that changes may be made in form and detail without departing from the scope of the invention. Thus the invention is limited only by the following claims.

What is claimed is:

1. A method of manufacturing a semiconductor device, the method comprising:
   forming a plurality of isolation trenches in a substrate;
   filling the isolation trenches with a trench dielectric;
   forming a tunnel oxide layer on the substrate above active areas of the semiconductor device between the isolation trenches;
   forming a first polysilicon layer on the tunnel oxide layer to provide a plurality of floating gates;

forming a gate dielectric layer on the floating gates above the active areas and on exposed portions of the trench dielectric;

forming a second polysilicon layer on the gate dielectric layer;

partially etching the second polysilicon layer above the isolation trenches, wherein at least a portion of the second polysilicon layer above the isolation trenches remains following the partial etching; and further etching the second polysilicon layer and the gate dielectric layer above the isolation trenches, wherein a remaining portion of the second polysilicon layer above the active areas provides a plurality of control gates.

2. The method of claim 1, wherein the partial etching does not etch the trench dielectric from the isolation trenches.

3. The method of claim 1, wherein portions of the second polysilicon layer and the gate dielectric layer above the isolation trenches are completely removed by the further etching.

4. The method of claim 1, wherein the partial etching and the further etching delineate a plurality of stacked gate structures for a plurality of non-volatile memory cells.

5. The method of claim 1, wherein the semiconductor device is a flash memory.

6. The method of claim 1, wherein the isolation trenches and the trench dielectric comprise shallow trench isolation (STI) trenches.

7. The method of claim 1, wherein the gate dielectric layer comprises an oxide/nitride/oxide (ONO) layer.

8. The method of claim 1, wherein the gate dielectric layer has a thickness of approximately 170 angstroms prior to the etching steps.

9. The method of claim 1, wherein the second polysilicon layer has a thickness in a range of approximately 2300 to approximately 3300 angstroms prior to the etching steps.

10. The method of claim 1, wherein the second polysilicon layer has a depth of approximately 800 angstroms following the partial etching step and prior to the further etching step.

11. The method of claim 1, wherein the further etching step removes the trench dielectric by a depth less than approximately 500 angstroms.

12. The method of claim 1, wherein the further etching step is performed for at least 120 seconds.

13. The method of claim 1, further comprising:
etching a portion of the first polysilicon layer to expose source/drain regions in the active areas; and
providing source/drain implants in the exposed source/drain regions of the active areas, wherein the isolation trenches isolate the source/drain implants in adjacent active areas.

14. The method of claim 1, wherein the partial etching step exhibits a selectivity between polysilicon and oxide of at least greater than 10:1.

15. The method of claim 14, wherein the partial etching step is performed using at least one of chlorine (Cl2) and hydrogen bromide (HBr).

16. The method of claim 1, wherein the further etching step exhibits a selectivity between polysilicon and oxide of at lest 2:1.

17. The method of claim 16, wherein the further etching step is a fluorine-based etch.

18. A method of manufacturing a semiconductor device, the method comprising:

forming a plurality of shallow trench isolation (STI) trenches in a substrate;

forming a tunnel oxide layer, a first conductive layer, a gate dielectric layer, and a second conductive layer above the substrate; and etching the first conductive layer, the gate dielectric layer, and the second conductive layer to delineate a plurality of stacked gate structures, wherein the etching comprises:

performing a first etch of the second conductive layer, wherein at least a portion of the second conductive layer above the STI trenches remains following the first etch, and performing a second etch of the second conductive layer, wherein the remaining portion of the second conductive layer above the STI trenches and portions of the gate dielectric layer above the STI trenches are completely removed by the second etch.

19. The method of claim 18, wherein the first conductive layer provides a plurality of floating gates and the second conductive layer provides a plurality of control gates.

20. The method of claim 18, wherein the first etch does not etch the STI trenches.

21. The method of claim 18, wherein the second conductive layer has a depth of approximately 800 angstroms following the first etch and prior to the second etch.

22. The method of claim 18, further comprising:
performing an etch of a portion of the first conductive layer to expose source/drain regions in active areas of the substrate; and
providing source/drain implants in the exposed source/drain regions of the active areas, wherein the STI trenches isolate the source/drain implants in adjacent active areas.

23. A non-volatile memory comprising:
a substrate;
a plurality of isolation trenches in the substrate;
a trench dielectric in the isolation trenches;
a plurality of active areas in the substrate between the isolation trenches;
a plurality of stacked gate structures above the active areas, wherein each of the stacked gate structures comprise:
a tunnel oxide layer on the substrate,
a floating gate formed from a first conductive layer on the tunnel oxide layer,
a gate dielectric layer on the floating gate, and
a control gate formed from a second conductive layer on the gate dielectric layer; and
wherein the stacked gate structures are delineated by:
portions of the second conductive layer subjected to a first partial etch and a second complete etch, and
portions of the gate dielectric layer subjected to the second complete etch.

24. The non-volatile memory of claim 23, wherein the stacked gate structures are further delineated by portions of the trench dielectric subjected to the second complete etch.

25. The non-volatile memory of claim 23, wherein the trench dielectric exhibits a depth reduced by less than approximately 500 angstroms from second complete etch.

* * * * *